United States Patent
Chen et al.

(10) Patent No.: US 10,090,392 B2
(45) Date of Patent: Oct. 2, 2018

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: I-Chih Chen, Tainan (TW); Chih-Mu Huang, Tainan (TW); Ling-Sung Wang, Tainan (TW); Ying-Hao Chen, Tainan (TW); Wen-Chang Kuo, Tainan (TW); Jung-Chi Jeng, Tainan (TW)

(73) Assignee: Taiwan Semiconductor Manufacturing Company Ltd., Hsinchu (TW)

(*) Notice: Subject to any disclaimer, the term of this patent is extended or adjusted under 35 U.S.C. 154(b) by 205 days.

(21) Appl. No.: 14/158,643

(22) Filed: Jan. 17, 2014

(65) Prior Publication Data

US 2015/0206945 A1   Jul. 23, 2015

(51) Int. Cl.
*H01L 29/417*  (2006.01)
*H01L 29/08*  (2006.01)
*H01L 29/66*  (2006.01)
*H01L 21/285*  (2006.01)
*H01L 29/78*  (2006.01)

(Continued)

(52) U.S. Cl.
CPC .. *H01L 29/41783* (2013.01); *H01L 21/28518* (2013.01); *H01L 21/28525* (2013.01); *H01L 21/324* (2013.01); *H01L 23/485* (2013.01); *H01L 29/0847* (2013.01); *H01L 29/41775* (2013.01); *H01L 29/45* (2013.01); *H01L 29/665* (2013.01); *H01L 29/6659* (2013.01); *H01L 29/66628* (2013.01); *H01L 29/66636* (2013.01); *H01L 29/78* (2013.01); *H01L 29/7834* (2013.01); *H01L 21/76804* (2013.01); *H01L 21/76843* (2013.01); *H01L 21/76855* (2013.01); *H01L 21/76877* (2013.01);

(Continued)

(58) Field of Classification Search
CPC ......... H01L 29/41783; H01L 29/66628; H01L 29/665; H01L 29/66636; H01L 29/7834; H01L 21/823814; H01L 21/28518; H01L 21/76877

See application file for complete search history.

(56) References Cited

U.S. PATENT DOCUMENTS 5,746,884 A * 5/1998 Gupta ............... H01L 21/76804
257/E21.578
8,592,916 B2 * 11/2013 Khakifirooz .......... H01L 27/088
257/353

(Continued)

*Primary Examiner* — Matthew Reames
*Assistant Examiner* — John Bodnar
(74) *Attorney, Agent, or Firm* — WPAT, P.C., Intellectual Property Attorneys; Anthony King

(57) ABSTRACT

A semiconductor device includes a metal oxide semiconductor device disposed over a substrate and an interconnect plug. The metal oxide semiconductor device includes a gate structure located on the substrate and a raised source/drain region disposed adjacent to the gate structure. The raised source/drain region includes a top surface above a surface of the substrate by a distance. The interconnect plug connects to the raised source/drain region. The interconnect plug includes a doped region contacting the top surface of the raised source/drain region, a metal silicide region located on the doped region, and a metal region located on the metal silicide region.

19 Claims, 11 Drawing Sheets

(51) Int. Cl.
    *H01L 29/45*      (2006.01)
    *H01L 21/324*     (2006.01)
    *H01L 23/485*     (2006.01)
    *H01L 29/165*     (2006.01)
    *H01L 21/768*     (2006.01)

(52) U.S. Cl.
    CPC ........ *H01L 29/165* (2013.01); *H01L 29/7848* (2013.01); *H01L 2924/0002* (2013.01)

(56) References Cited

U.S. PATENT DOCUMENTS

| | | | |
|---|---|---|---|
| 2006/0131665 A1* | 6/2006 | Murthy | H01L 29/665 257/384 |
| 2007/0298558 A1* | 12/2007 | Yamauchi | H01L 21/26513 438/197 |
| 2008/0070384 A1* | 3/2008 | Murthy | H01L 29/7848 438/482 |
| 2010/0301392 A1* | 12/2010 | Ko et al. | 257/192 |
| 2011/0057270 A1* | 3/2011 | Nishikawa | H01L 21/823807 257/408 |
| 2011/0068396 A1* | 3/2011 | Cheng | H01L 29/165 257/335 |
| 2011/0254090 A1* | 10/2011 | Cheng | H01L 29/66772 257/347 |
| 2012/0104470 A1* | 5/2012 | Ponoth | H01L 29/66545 257/288 |
| 2013/0249006 A1* | 9/2013 | Khakifirooz | H01L 27/088 257/368 |
| 2013/0307074 A1* | 11/2013 | Cheng et al. | 257/347 |

* cited by examiner

SEMICONDUCTOR DEVICE AND MANUFACTURING METHOD THEREOF

PRIORITY CLAIM AND CROSS-REFERENCE

The present disclosure relates to a semiconductor device and in particular, to a semiconductor device with a low contact resistance and a method of manufacturing a semiconductor device.

BACKGROUND

A significant trend throughout integrated circuit (IC) development is the downsizing of IC components. As the size reduces, the performance requirements become more stringent. Also, as devices continue to shrink in size, the channel region continues to shrink as well. For metal-oxide-semiconductor field effect transistors (MOSFETs), increased performance requirements have generally been met by aggressively scaling the length of the channel region. However, such a short channel length faces high electric field and manufacturing limits.

With regard to the scaling of integrated circuits, the current performance of devices is highly relative to the total resistances of such devices. The device drive currents are inversely proportional to the total resistance. The total resistance includes a channel resistance $R_{CH}$ and an external resistance $R_{EXT}$. In 45 nm technology and below, the external resistance $R_{EXT}$ dominates performance of the device drive currents. In addition, it is found that contact resistance holds a majority of the external resistance $R_{EXT}$. However, high contact resistance causes the device drive currents to reduce. In order to obtain higher drive currents, a new structure with a low contact resistance and its manufacturing method are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
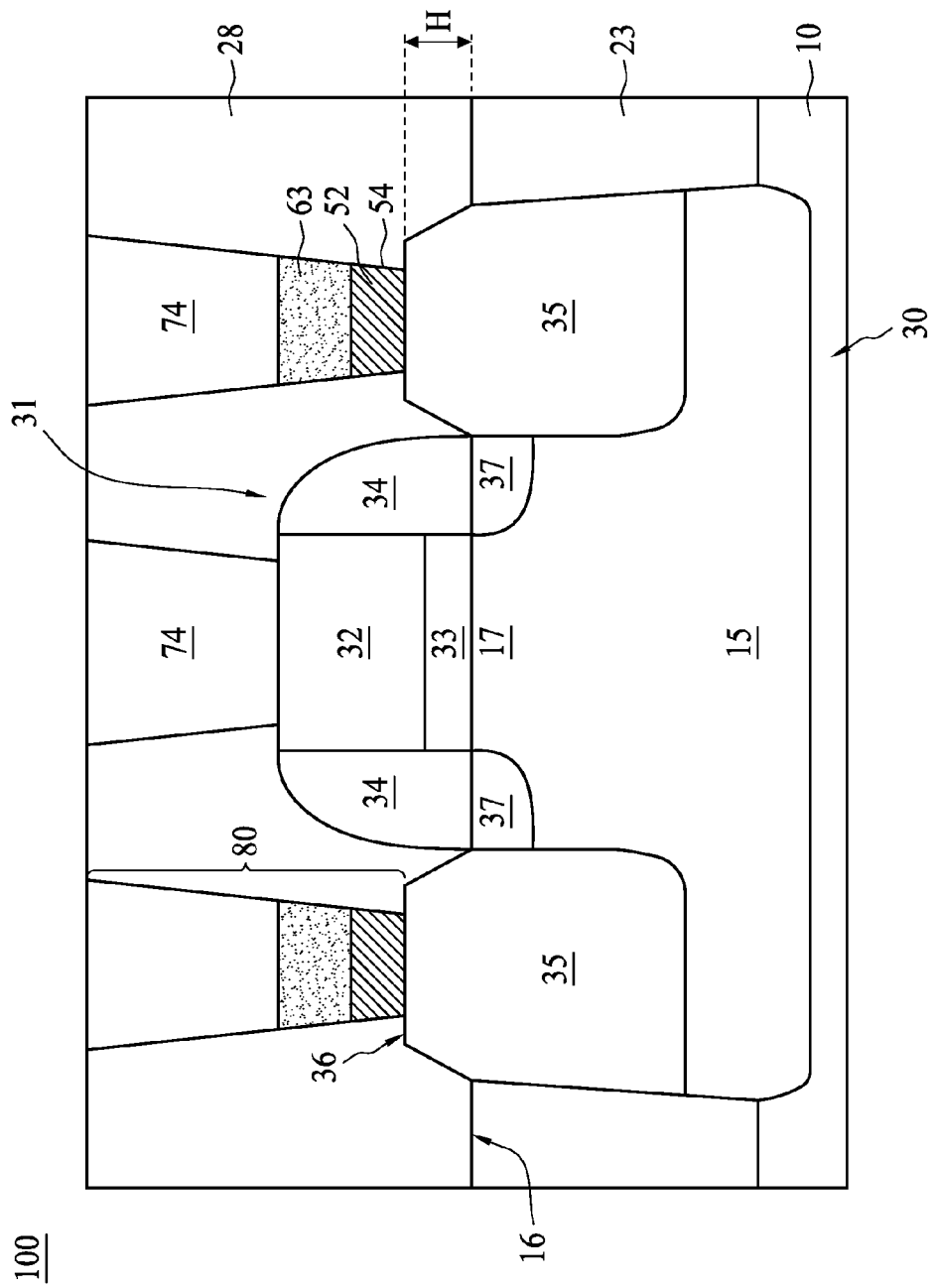
FIG. 1 is a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductor structures.

The term "isolation," as used herein, refers to an oxide structure or a dielectric structure for isolating devices. There are two typical formation processes, one is Local Oxidation of Silicon (LOCOS) and the other is Shallow Trench Isolation (STI). In an image sensor, the isolation is disposed between imaging pixels and adjacent imaging pixels so as to isolate the adjacent imaging pixels. In addition, the isolation is configured to act as a barrier to keep charge carriers (holes or electrons) from penetrating into an adjacent imaging pixel.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

The external resistance $R_{EXT}$ results from source/drain extension region resistance, source/drain resistance, source/drain contact resistance, and interconnect resistance. Impurity doping the source/drain regions to reduce the source/drain contact resistance is one of the approaches adopted in the industry. However, as the dopant concentration reaches about 1E20 atoms/cm$^3$, the dopants will easily diffuse into channel regions and induce short channel effects during a thermal process. In the present disclosure, a semiconductor structure is fabricated to include a low resistance contact plug to reduce the source/drain contact resistance, while still maintaining the dopant concentration in the source/drain under a predetermined level.

In reference to the Figures, FIG. 1 is a semiconductor device 100 in accordance with some embodiments of the present disclosure. The semiconductor device 100 is formed on a substrate 10. In an embodiment, the substrate 10 is an SOI substrate. The SOI substrate includes a bulk silicon layer, a buried insulation layer and an active layer, wherein semiconductor devices are formed in and above the active layer. In an embodiment, the substrate 10 is a silicon substrate or made of materials other than silicon. The semiconductor device 100 includes a metal oxide semiconductor device 30, isolations 23, and interconnect plugs 80.

The metal oxide semiconductor device 30 is a p-type metal oxide semiconductor field effect transistor or an n-type metal oxide semiconductor field effect transistor. The metal oxide semiconductor device 30 includes a gate structure 31, a doped well region 15, a channel region 17, raised source/drain regions 35, and extension regions 37. The first gate structure 31 further includes a gate electrode 32, a gate dielectric 33, and sidewall spacers 34.

With regard to the metal oxide semiconductor device 30, the gate structure 31 is located on the substrate 10. The doped well region 15 is formed in the substrate 10. The channel region 17, the extension regions 37, and the raised source/drain regions 35 are formed within the doped well region 15. Further, the channel region 17 is disposed below the gate structure 31. The raised source/drain regions 35 are disposed on opposite sides of the gate structure 31. The extension regions 37 are disposed on opposite sides of the channel region 17. Moreover, the raised source/drain regions 35 are disposed adjacent to the extension regions 37. The sidewall spacers 34 conform to a stack of the gate electrode 32 and the gate dielectric 33. Bottom portions of the sidewall spacers 34 are over the extension regions 37.

The doped well region 15 is formed in the substrate 10. In an embodiment, the doped well region 15 is an n-type well. Thus, the doped well region 15 includes dopants, for example, phosphorous, arsenic, and/or antimony. In an embodiment, the doped well region 15 is a p-type well. Thus, the doped well region 15 includes dopants, for example, boron, germanium, and/or indium. Since the doped well region 15 is a foundation for manufacturing devices, the channel region 17 obtains features of the doped well region 15. As such, the channel region 17 includes a dopant material that is the same as that of the doped well region 15.

The gate dielectric 33 is located on the channel region 17. In some embodiments, the gate dielectric 33 includes silicon dioxide or, in an alternative embodiment, a high dielectric constant (K) material. In some embodiments, the gate dielectric 33 includes a dielectric material based on silicon oxide, e.g., silicon oxynitride, silicon oxide, or a stack of at least one silicon oxide and at least one silicon nitride. In some embodiments, the gate dielectric 33 includes a dielectric metal oxide having a dielectric constant greater than 8.0, which is known as a high-k dielectric material. Exemplary high-k dielectric materials include $HfO_2$, $ZrO_2$, $La_2O_3$, $Al_2O_3$, $TiO_2$, $SrTiO_3$, $LaAlO_3$, $HfO_xN_y$, $Y_2O_3$, $LaAlO_xN_y$, $Al_2O_xN_y$, $ZrO_xN_y$, $La_2O_xN_y$, $TiO_xN_y$, $SrTiO_xN_y$, $Y_2O_xN_y$, and an alloy thereof. Each value of x is independently from 0.1 to 3.0 and each value of y is independently from 0.1 to 2.0.

The gate electrode 32 is located on the gate dielectric 33. In some embodiments, the gate electrode 32 includes standard polysilicon. In some embodiments, the gate electrode 32 includes amorphous polysilicon material, a metal material, silicided metal material, or a stack of at least one metallic material and at least one semiconductor material. The gate electrode 32 serves as a gate terminal in order to control the channel region 17. The material is chosen to meet the requirement of resistance. In an embodiment, a metal region 74 connects to the gate electrode 32. The metal region 74 is formed of, for example, tungsten, copper or aluminum. The metal region 74 serves as a metal wire or an interconnection for connecting with other devices.

The sidewall spacers 34 conform to the stack of the gate electrode 32 and the gate dielectric 33. In addition, the sidewall spacers 34 are respectively located on opposite sides of the stack. In some embodiments, the sidewall spacers 34 include silicon nitride. In some embodiments, the sidewall spacers 34 include silicon dioxide, silicon carbide, or silicon oxy-nitride, without limitation. Specifically, material of the sidewall spacers 34 is different from the material of the gate electrode 32. The sidewall spacers 34 are configured as a mask to shield the extension regions 37 during formation of the raised source/drain regions 35.

The extension regions 37 are located under the sidewall spacers 34. Further, the extension regions 37 are disposed on opposite sides of the channel region 17. In some embodiments, the extension regions 37 are p-type regions or n-type regions. The extension regions 37 are lightly doped (LDD), medium doped (MDD), or heavily doped (HDD) extension regions in accordance with various requirements. The extension regions 37 can adjust an electric field in the channel region 17. Moreover, the extension regions 37 should have a dopant type opposite to that of the doped well region 15.

The raised source/drain regions 35 are disposed adjacent to the gate structure 31. In addition, the raised source/drain regions 35 include a top surface 36 above a surface 16 of the substrate 10 by a distance H. A raised portion of the raised source/drain region 35 has a thickness ranging from the surface 16 to the top surface 36, which refers to the distance H. The top surface 36 is higher than the surface 16, for example, by the distance H of between about 5 angstroms and about 15 angstroms. In an embodiment, the distance H ranges from about 5 angstroms to about 25 angstroms. The raised source/drain regions 35 are formed, for example, by epitaxial growth of a semiconductor material within a cavity in the substrate 10. Because the epitaxial growth forms the raised source/drain regions 35 layer by layer, it is sufficient to control an area of the top surface 36 or profile of the raised source/drain regions 35. By controlling the time of the epitaxial growth, the raised source/drain regions 35 are able to raise or elevate from the surface 16. Moreover, the raised source/drain regions 35 taper from the surface 16 of the substrate 10 toward the top surface 36. Specifically, the sidewall spacers 34 are not in contact with the raised portion of the raised source/drain regions 35. Separation between the gate structure 31 and the raised source/drain regions 35 prevents unnecessary conducting paths or influences of electrical properties, for example, a leakage current or capacitance variation.

The raised source/drain regions 35 are a crystallized region, for example, including a single crystalline or polycrystalline semiconductor. The raised source/drain regions 35 include a single crystalline semiconductor material that is epitaxially aligned to the underlying semiconductor material, which is the semiconductor material of the doped well region 15. In some embodiments, the single crystalline semiconductor material includes a single crystalline silicon-germanium alloy, a single crystalline silicon-carbon alloy, or any single crystalline semiconductor material that can be epitaxially grown on single crystalline silicon. The raised source/drain regions 35 including germanium or carbon provide a tensile or a compress strain to the channel region 17. In an embodiment, the raised source/drain regions 35 include an in-situ doped single crystalline semiconductor material. The in-situ dopant is opposite to the polarity of the doped well region 15 including, for example, boron, germanium, indium, phosphorous, arsenic, and/or antimony. The raised source/drain regions 35 generally have a peak dopant concentration ranging from about 1E19 atoms/cm$^3$ to about 2E20 atoms/cm$^3$. In an embodiment, distribution in the raised source/drain regions 35 is uniform. In an embodiment, concentration becomes denser from its bottommost portion to the top surface 36. For example, concentration at the bottom is about 1E19 atoms/cm$^3$, and concentration near the top surface 36 is about 1E20 atoms/cm$^3$.

The interconnect plug 80 is connected to the raised source/drain regions 35. In FIG. 1, there are two interconnect plug 80 that are disposed opposite to the gate structure 31. The one right to the gate structure 31 is used as an example for the following detailed description. The interconnect plug 80 includes a doped region 52, a metal silicide region 63 and a metal region 74. The doped region 52 is at the bottom of the interconnect plug 80. The metal region 74 is at the top of the interconnect plug 80. The metal silicide region 63 is sandwiched by the doped region 52 and the metal region 74. The doped region 52 contacts the top surface 36 of the raised source/drain regions 35. The metal silicide region 63 is located on the doped region 52. The metal region 74 is located on the metal silicide region 63.

The interconnect plug 80 tapers from its topmost portion toward the top surface 36. In other words, the size of the interconnect plug 80 shrinks from its topmost portion to its bottommost portion. Accordingly, the doped region 52 tapers from its topmost portion toward the raised source/drain regions 35. The doped region 52 connects to the raised source/drain regions 35. A contacting area between the doped region 52 and the raised source/drain regions 35 is smaller than the top surface 36. Accordingly, the bottom end of the doped region 52 lands a portion of the top surface 36. Since the size of the doped region 52 shrinks from its topmost portion toward the top surface 36, the top surface 36 angles with a sidewall 54 of the doped region 52 by less than 90 degrees. Further, the sidewall 54 refers to an external sidewall of the doped region 52.

The doped region 52 is a crystallized region, for example, including a single crystalline or polycrystalline semiconductor. In an embodiment, the doped region 52 is made of a single crystalline semiconductor material that is epitaxially aligned to the underlying semiconductor material, which is the semiconductor material of the raised source/drain region 35. In some embodiments, the doped region 52 includes a single crystalline silicon-germanium alloy, a single crystalline silicon-carbon alloy, or any single crystalline semiconductor material that can be epitaxially grown on single crystalline silicon. The doped region 52 includes an epitaxial semiconductor material that is the same as that of the raised source/drain region 35. In other words, the doped region 52 and the raised source/drain region 35 are made of the same kind of single crystalline semiconductor material. In an embodiment, material of the doped region 52 is different from that of the raised source/drain region 35. For example, the doped region 52 is made of single crystalline silicon-germanium alloy, whereas the raised source/drain region 35 is made of single crystalline silicon-carbon alloy. Further, the doped region 52 includes a dopant material that is the same as that of the raised source/drain region 35. The doped region 52 generally has a peak dopant concentration ranging from about 1E21 atoms/cm$^3$ to about 1E23 atoms/cm$^3$. The doped region 52 includes a dopant concentration from 10 to 100 times higher than that of the raised source/drain region 35. That is, the doped region 52 includes a dopant concentration higher than that of the raised source/drain region 35.

In some embodiments, the doped region 52 has a thickness of about 5 angstroms to 20 angstroms. The raised portion of the raised source/drain region 35 has a thickness ranging from the surface 16 to the top surface 36, which refers to the distance H. The distance H ranges from about 5 angstroms to 15 angstroms. In an embodiment, a thickness ratio between the doped region 52 and the distance H is 1:2 or 2:1. In an embodiment, a thickness ratio between the doped region 52 and the distance H is 1:1. In an embodiment, a thickness ratio between the doped region 52 and the distance H is 2:3 or 3:2. The raised portion of the raised source/drain region 35 is thin enough so that the raised portion is apart from the gate structure 31. Thus, the total thickness of the doped region 52 and the distance H ranges from about 25 angstroms to 40 angstroms.

The doped region 52 is located on the raised source/drain region 35. Effectively, the doped region 52 generally has a peak dopant concentration ranging from about 1E21 atoms/cm$^3$ to about 1E23 atoms/cm$^3$. The raised source/drain region 35 has a limitation of concentration around 1E20 atoms/cm$^3$ due to dopant diffusion. The doped region 52 includes a higher dopant concentration that overcomes the limitation of 1E20 atoms/cm$^3$. Thus, the doped region 52 provides a lower resistance than the raised source/drain region 35 so that the source/drain contact resistance is reduced. Thus, the total resistance is dramatically reduced so that the device drive currents will be boosted by the doped region 52. In addition, the doped region 52 is formed on the top surface 36 that is elevated from the surface 16. Dopants in the doped region 52 cannot diffuse into the channel region 17 during a front or back end annealing.

The metal silicide region 63 is located on the doped region 52. Further, the metal silicide region 63 is formed by an upper portion of the doped region 52. The metal silicide region 63 refers to a self-aligned silicide region. The metal silicide region 63 includes NiSi, PtSi or TiSi. The metal silicide region 63 reduces the metal-silicon contact resistivity by employing different metals and/or co-implants at the silicon-contact interface in order to reduce the Schottky barrier height. In addition, the doped region 52 connecting to the metal silicide region 63 reduces the contact resistance of their interface. Thus, the total resistance is dramatically reduced so that the device drive currents will increase through the implementation of the doped region 52 combined with the metal silicide region 63.

The metal region 74 is located on the metal silicide region 63 or the gate electrode 32. The metal region 74 includes, for example, tungsten, copper or aluminum. The metal region 74 serves as a wire or a via for connecting with other devices. In an embodiment, the metal region 74 tapers from its topmost portion toward the metal silicide region 63. The metal region 74, the metal silicide region 63, and the doped region 52 form a conductivity gradient from high to low. A sudden drop of conductivity between the metal silicide region 63 and the raised source/drain region 35 is reduced by the doped region 52. Due to the doped region 52, the interconnect plug 80 has a better electrical connection with the raised source/drain region 35.

Figure 2:
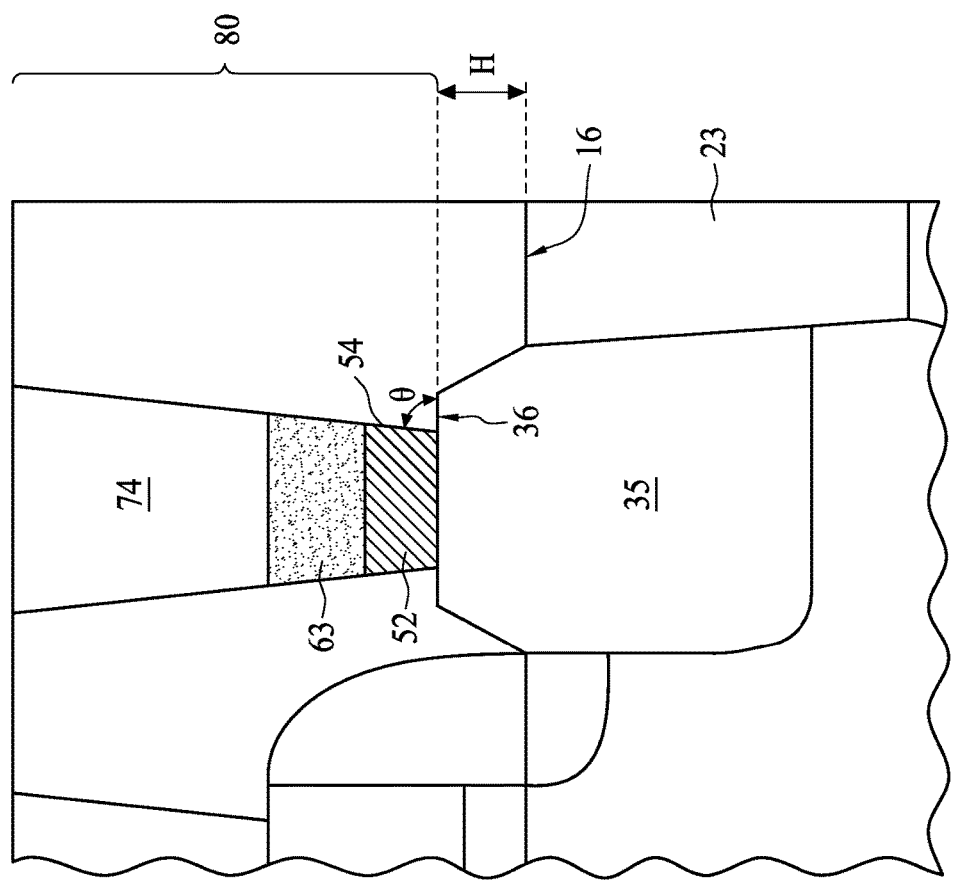
FIG. 2 is a zoom-in plot of an interconnect plug in accordance with some embodiments of the present disclosure.

FIG. 2 is a zoom-in plot of the interconnect plug 80 in accordance with some embodiments of the present disclosure. It is clear to see that the top surface 36 angles with a sidewall 54 of the doped region 52 by an angle θ. The sidewall 54 refers to an external sidewall of the doped region 52. The angle θ is less than or equal to 90 degrees because of the tapering of the interconnect plug 80. The doped region 52 is similar to the profile of the interconnect plug 80, which tapers from its topmost portion to its bottommost portion. In comparison, the doped region 52 does not elevate from the raised source/drain region 35. Further, the doped region 52 has a single crystalline semiconductor material that is the same as that of the raised source/drain region 35. There is a perfect connection between the doped region 52 and the raised source/drain region 35. The connection provides a lower contact resistance and a higher drive current. In addition, the doped region 52 is formed on the top surface 36 elevated from the surface 16. Dopants in the doped region 52 are difficult to diffuse into the channel region 17 during any thermal processes. Thus, the doped region 52 is able to obtain a higher dopant concentration that overcomes the limitation of 1E20 atoms/cm$^3$. The doped region 52 provides a lower resistance than the raised source/drain region 35 so that the source/drain contact resistance is reduced. As such, the total resistance is dramatically reduced so that the drive currents will be boosted by the doped region 52.

Figure 3A:
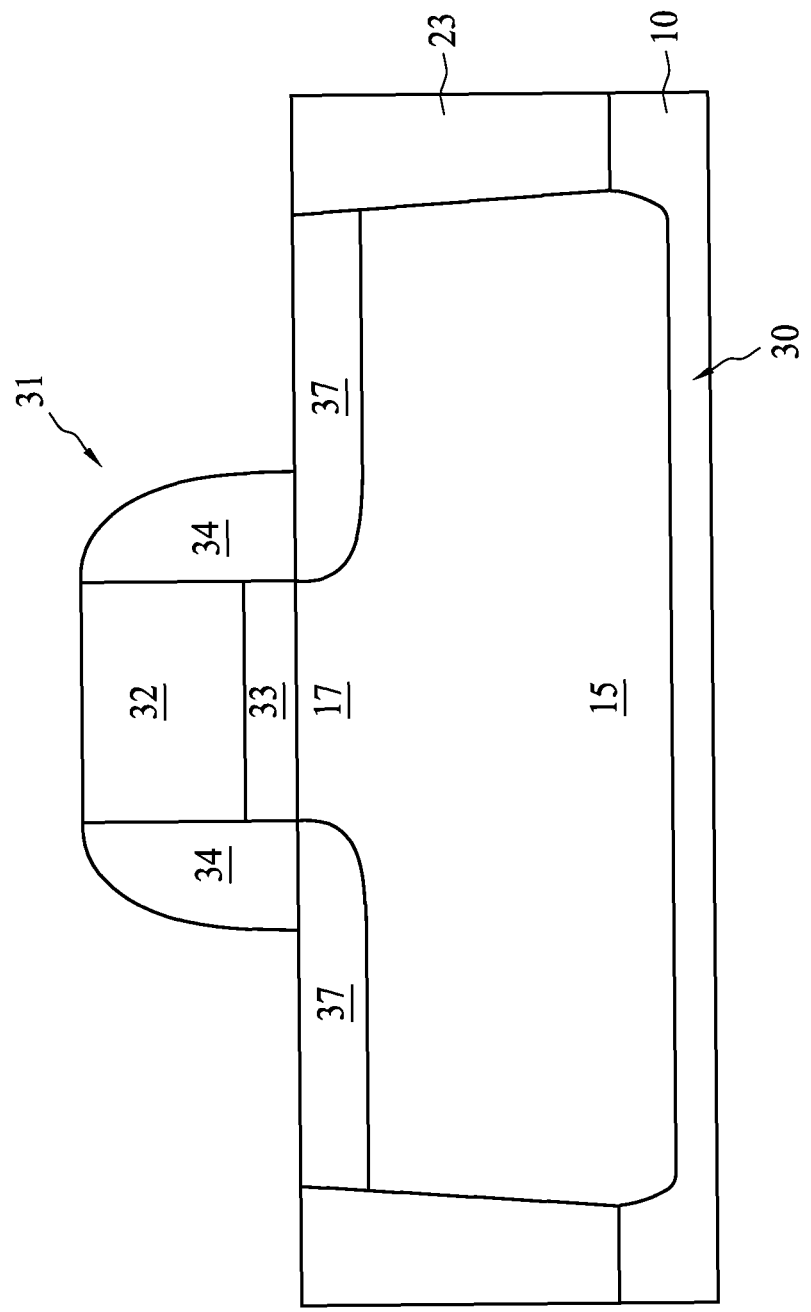
FIGS. 3A-3I are cross section diagrams illustrating a manufacturing process of the semiconductor device of FIG. 1 in accordance with some embodiments of the present disclosure.

FIGS. 3A-3I are cross section diagrams illustrating a manufacturing process of a semiconductor device 100 of FIG. 1 in accordance with some embodiments of the present disclosure. Each figure may refer to a step of a process for manufacturing the semiconductor device 100. FIG. 3A provides a substrate 10 having a gate structure 31, extension regions 37, a doped well region 15 and isolations 23. The isolations 23 define an active region of a metal oxide semiconductor device 30. In addition, the isolations 23 are configured to isolate various devices from one another. The isolations 23 are made by local oxidation of silicon (LOCOS) or shallow trench isolation (STI). Those skilled in the art shall understand the various steps used to form the isolations 23.

After forming the isolations 23, an implantation or a diffusion process is performed to form the doped well region 15 within the isolations 23. The doped well region 15 includes a p-type dopant or an n-type dopant. Later, a gate dielectric layer and a gate electrode layer is deposited and etched to form a stack of a gate electrode 32 and a gate dielectric 33. Next, the stack is regarded as a mask. An implantation is employed to form the extension regions 37 on opposite sides of the stack. The implantation includes a dopant material that is opposite to the polarity of the doped well region 15. A thermal process is typically used to activate the dopants in the extension regions 37. Next, a conformal layer of gate sidewall material is deposited on the stack in a blanketed fashion by using a CVD process with an appropriate thickness. Thereafter, the conformal layer of gate sidewall material is subjected to an anisotropic etch, thus resulting in a sidewall spacer 34.

Figure 3B:
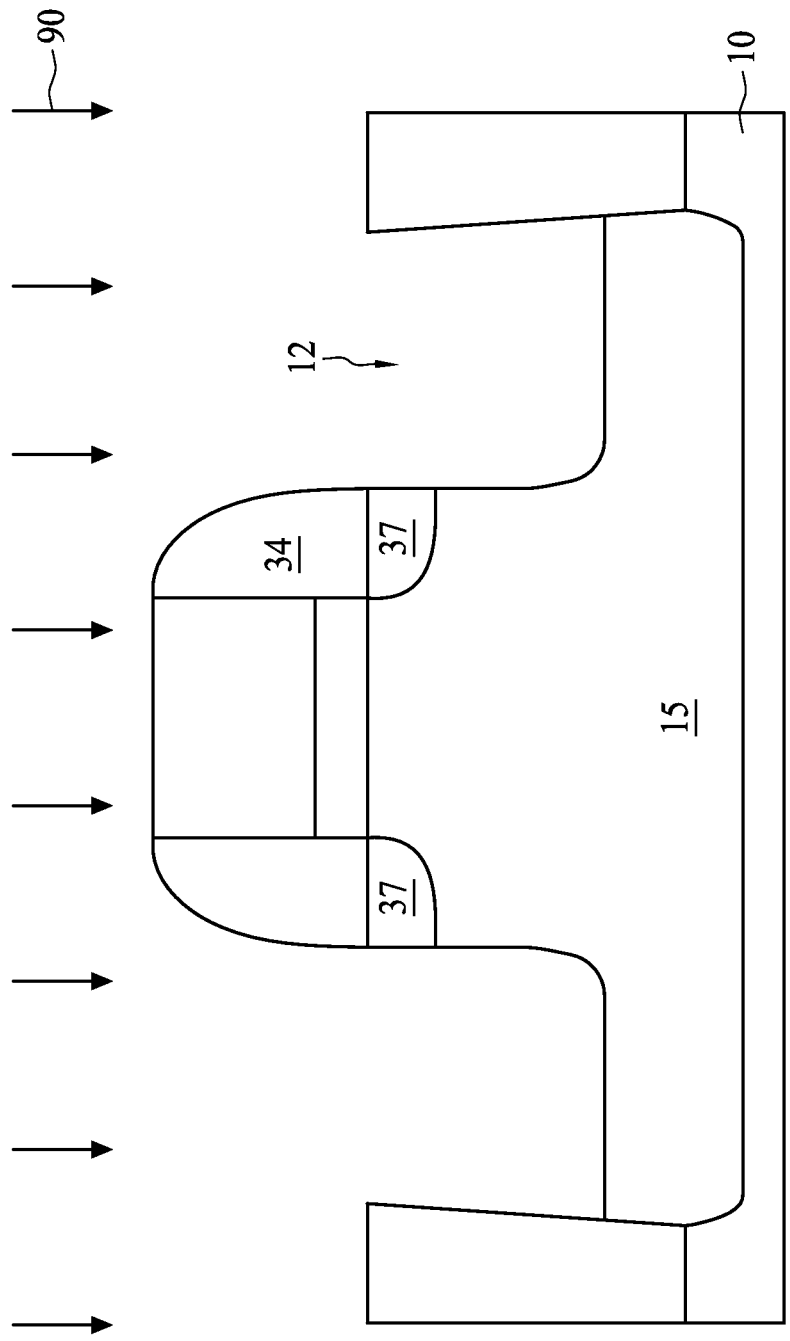

Referring to FIG. 3B, a cavity 12 is formed in the substrate 10 by using an etch process 90, wherein the gate structure 31 serves as a mask. The cavity 12 offsets from an edge of the sidewall spacer 34 and is adjacent to the gate structure 31. For example, the etch process 90 is an anisotropic etch. Though, due to the nature of the anisotropic etch, the extension regions 37 underneath the sidewall spacers 34 are not removed. Alternatively, an isotropic etch or combination of isotropic and anisotropic etches could be used. The cavity 12 is formed into the substrate 10 with a depth, for example, between about 10 nm and about 70 nm. It is also within the scope of the disclosure to etch the cavity 12 to any suitable depth.

Figure 3C:
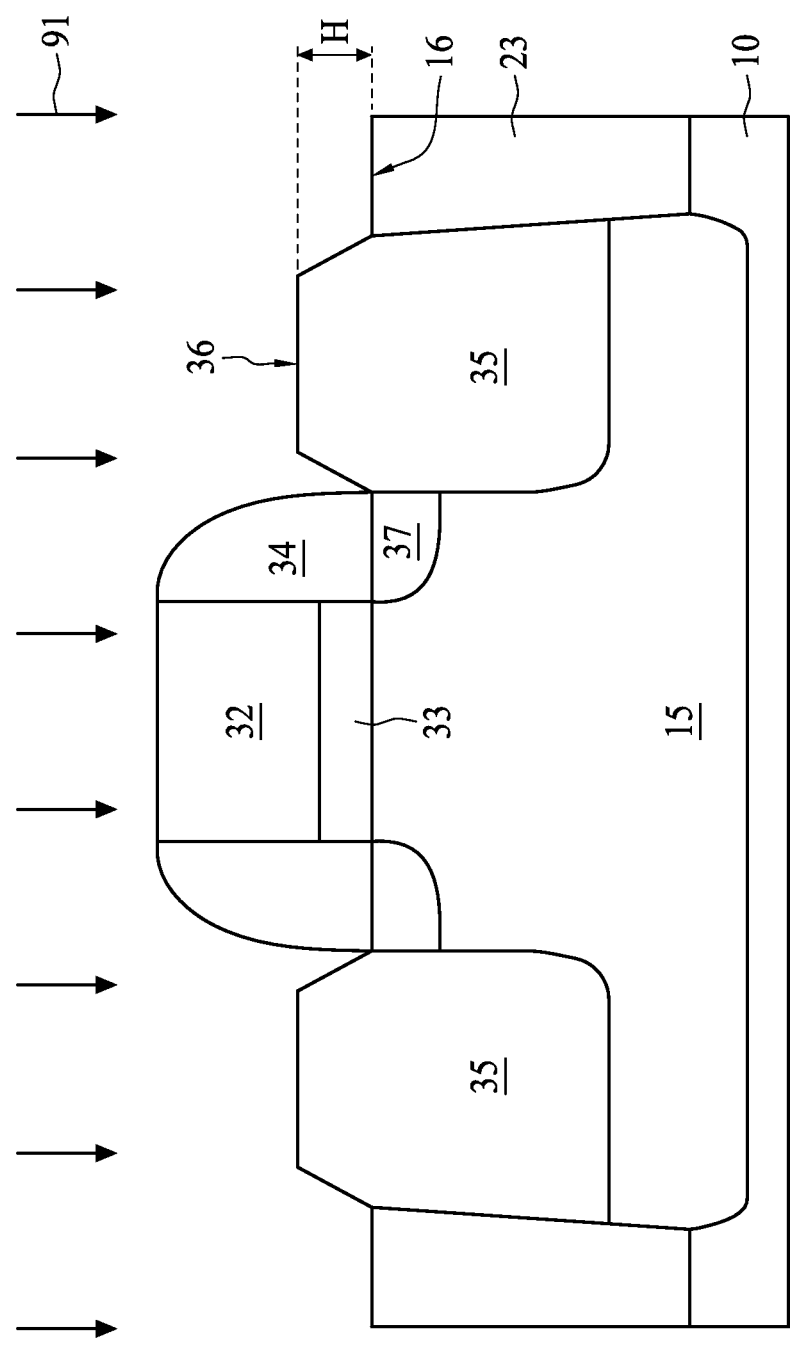

Referring to FIG. 3C, an epitaxial deposition process 91 is performed to epitaxially grow a film to fill the cavity 12, thereby forming raised source/drain regions 35. The epitaxial deposition process 91 selectively deposits within the cavity 12. The epitaxial deposition process 91 includes silicon germanium, silicon carbon or silicon. In addition, the raised source/drain regions 35 are doped in-situ with p-type or n-type dopants during the epitaxial deposition process 91. Moreover, the epitaxial deposition process 91 causes the raised source/drain regions 35 to extend above a surface 16 of the substrate 10. For example, the epitaxial deposition process 91 not only back-fills the cavity 12, but also continues to grow to a height above the surface 16 of the substrate 10. The top surface 36 is above the surface 16 of the substrate 10 by a distance H. By controlling the time of the epitaxial deposition process 91, the raised source/drain regions 35 have a profile that tapers from the surface 16 toward the topmost portion. The distance H is controlled to be smaller than a certain value so that the sidewall spacers 34 are apart from the raised source/drain regions 35. In addition, the epitaxial deposition process 91 is terminated by forming a top surface 36 on its topmost portion.

Figure 3D:
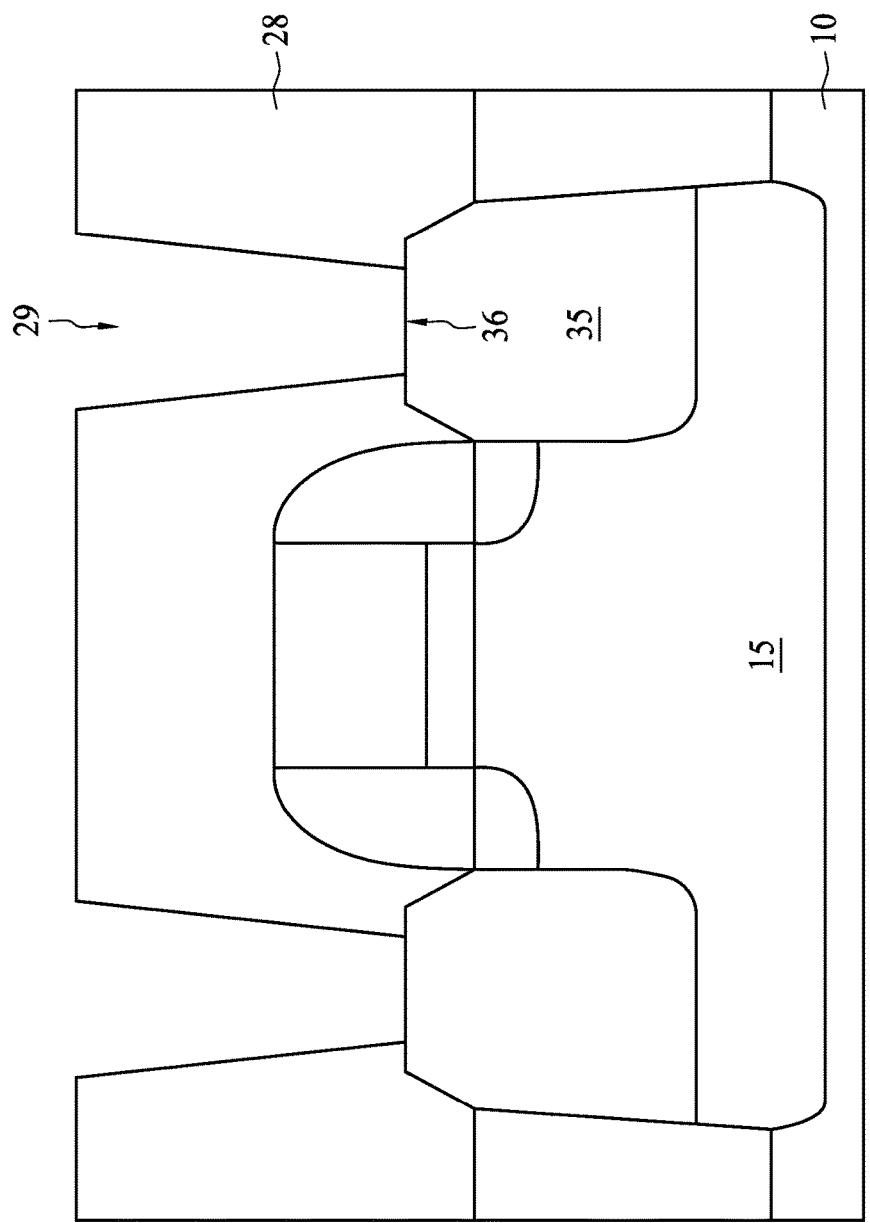

Referring to FIG. 3D, a dielectric layer 28 is deposited over the substrate 10. The dielectric layer 28 includes an oxide or a nitride. The dielectric layer 28 has a thickness, for example, in a range of about 50 nm to about 150 nm. A via pattern or a hard mask (not shown) is formed on the dielectric layer 28. Then, an etching process is employed to form a contact opening 29 in the dielectric layer 28 with regard to the via pattern. The contact opening 29 exposes a portion of the top surface 36 of the raised source/drain region 35. Further, the contact opening 29 tapers from the topmost portion of the dielectric layer 28 toward the top surface 36.

Figure 3E:
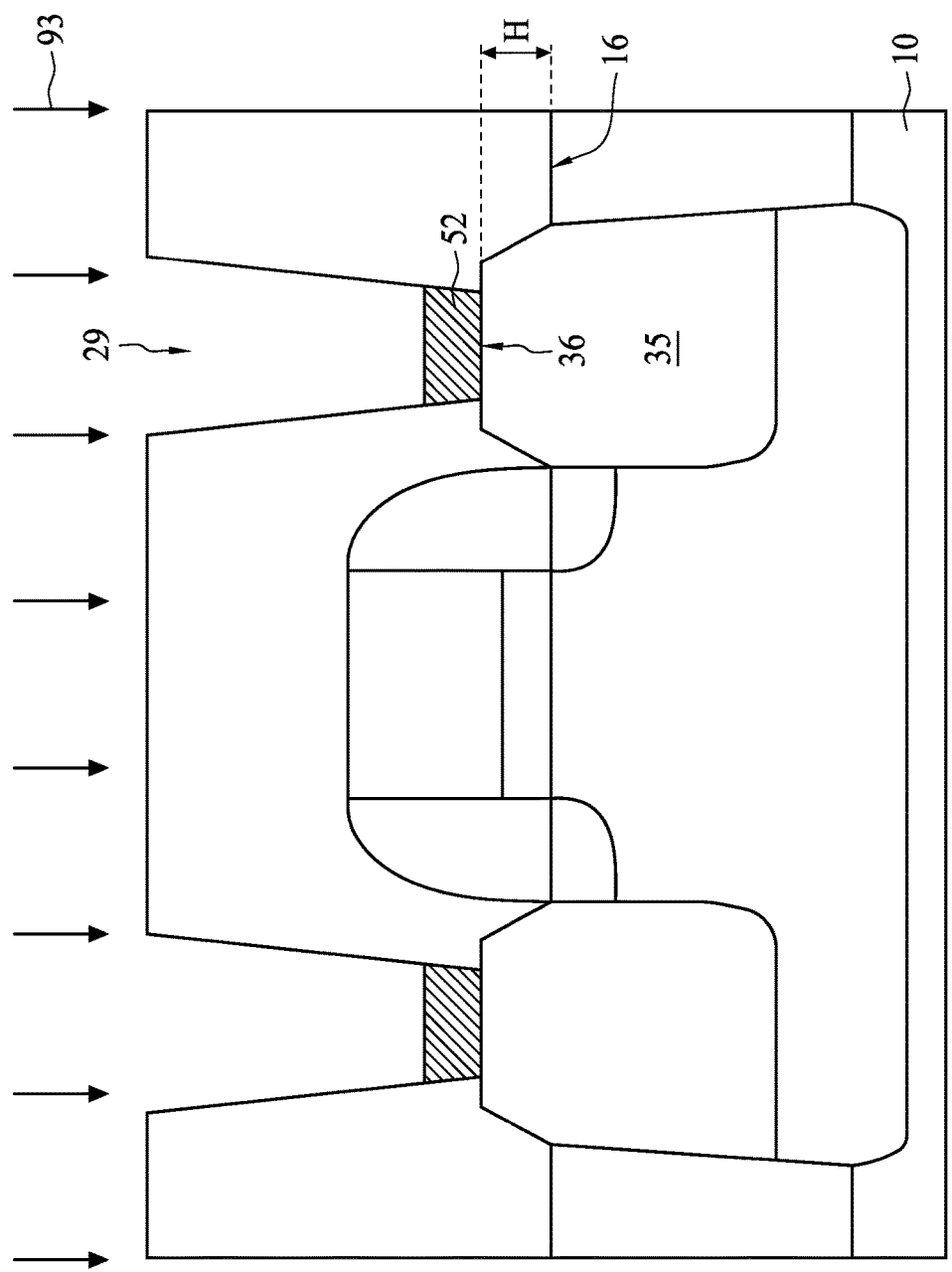

Referring to FIG. 3E, an epitaxial deposition process 93 is performed to selectively form a doped region 52 in the contact opening 29, wherein the doped region 52 connects with the raised source/drain region 35. The size of the doped region 52 is defined by the size of the contact opening 29. In other words, the size of epitaxial doped region 52 is constrained by the bottom portion of the contact opening 29. Thus, the doped region 52 covers merely a portion of the top surface 36. The epitaxial deposition process 93 includes silicon germanium, silicon carbon or silicon. In an embodiment, the semiconductor material of the top surface 36 serves as a seed for the epitaxial deposition process 93. Thus, the epitaxial deposition process 93 has an epitaxial semiconductor material that is the same as that of the epitaxial deposition process 91. Since the doped region 52 epitaxially grows based on the top surface 36, there are less interface traps or atom dislocations on the interface. Accordingly, contact resistance between the doped region 52 and the raised source/drain region 35 is reduced.

In addition, the epitaxial deposition process 93 forms the doped region 52 in-situ with p-type or n-type dopants. In comparison, an implantation or an annealing process easily drives the dopants to diffuse into channel regions. The in-situ doping is able to mitigate the unnecessary diffusion. Further, the distance H elevated from the surface 16 also prevents the dopants in the doped region 52 from diffusing into the channel regions. The epitaxial deposition process 93 includes a dopant concentration that is higher than that of the epitaxial deposition process 91. Thus, the doped region 52 provides a lower resistance than the raised source/drain region 35 for connection. The drive current increases because the doped region 52 reduces the contact resistance.

Figure 3F:
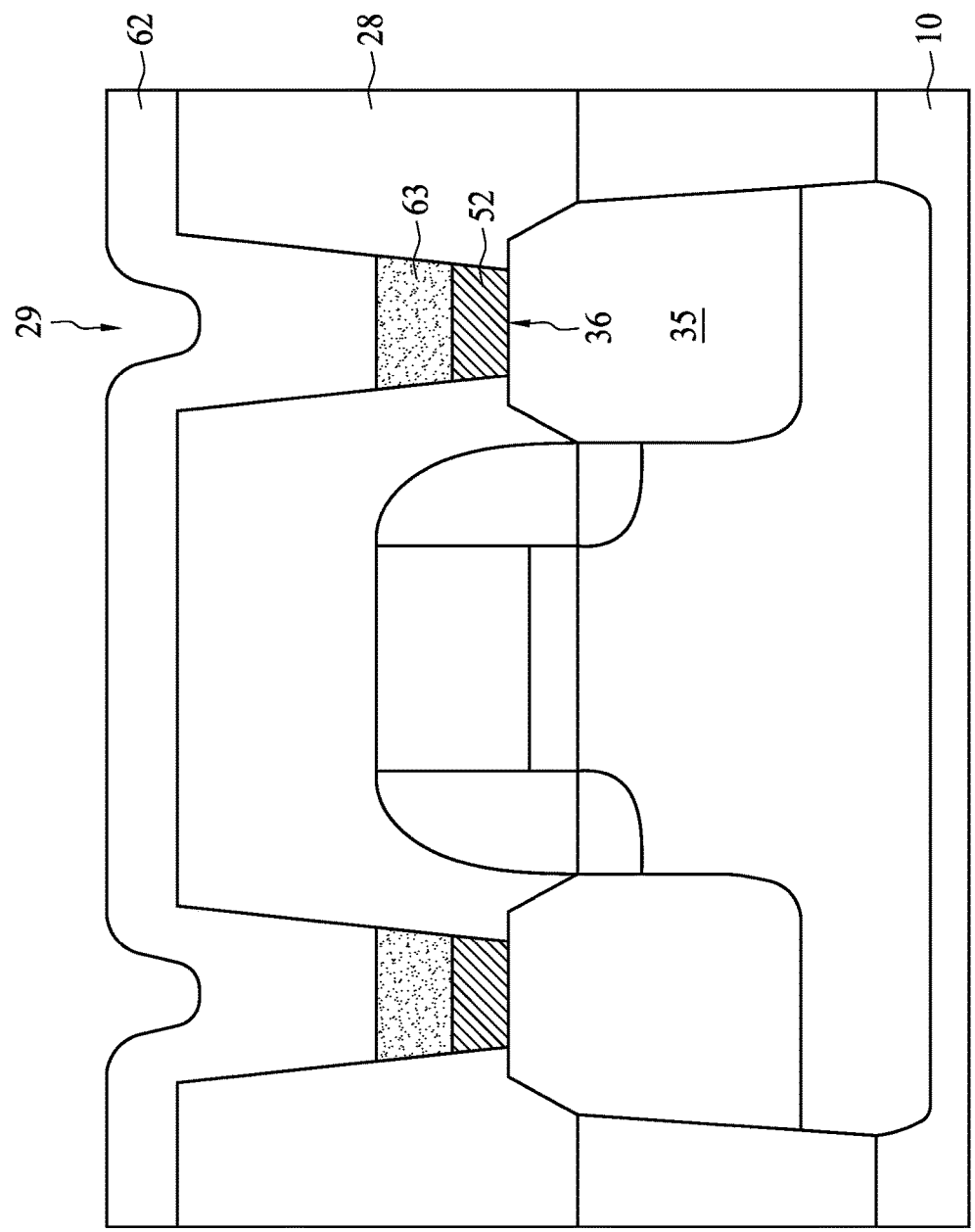
Figure 3G:
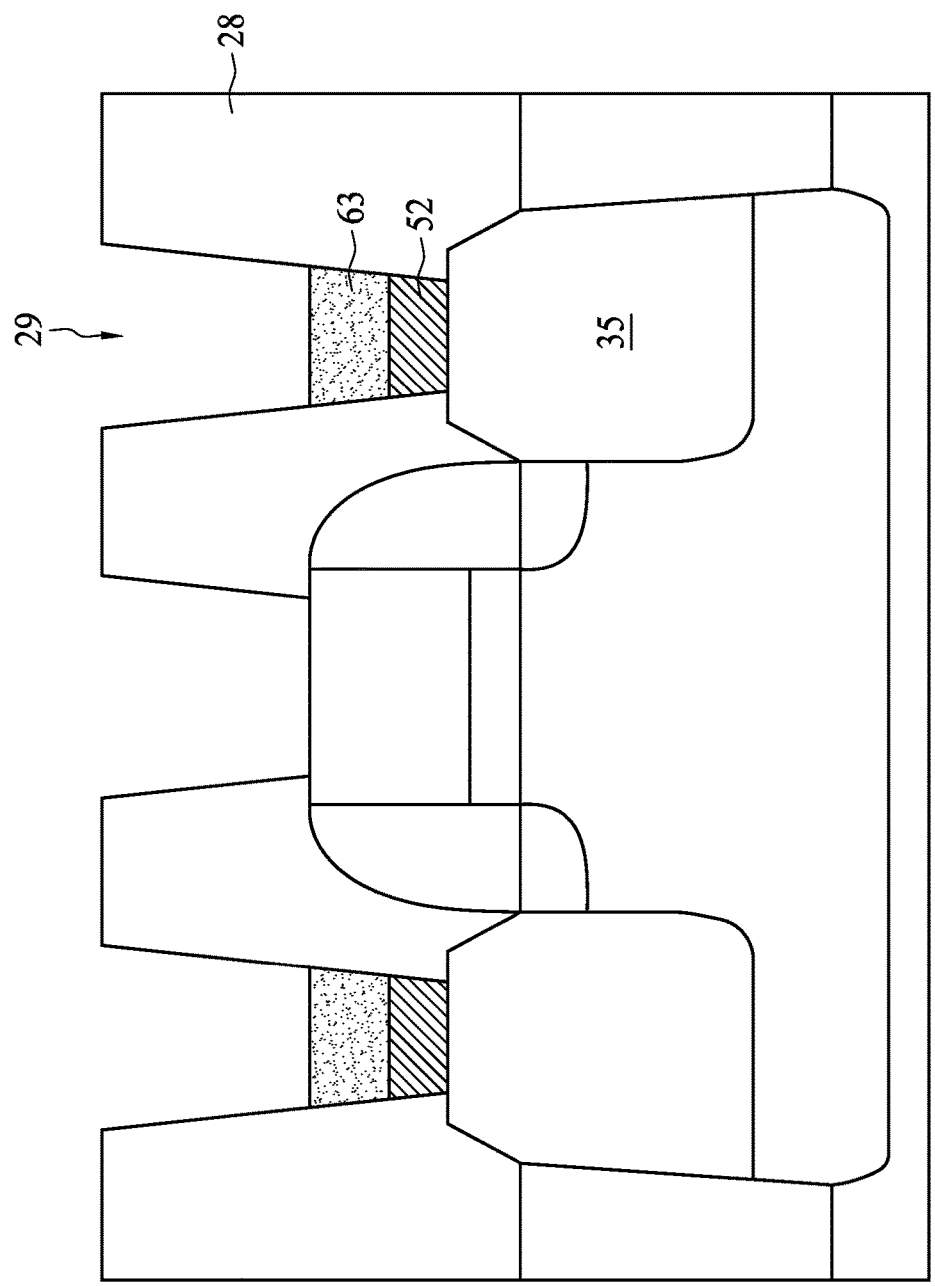

Referring to FIG. 3F, a metal layer 62 is deposited to cover the dielectric layer 28 and the doped region 52. Exemplary and non-limiting metals that can be deposited include nickel, platinum or titanium, and the metal thickness is preferably several angstroms, such as about 6 angstroms to about 8 angstroms. Later, an annealing process is performed to silicide an upper portion of the doped region 52. The annealing process thus produces a metal silicide region 63, for example, NiSi, PtSi or TiSi. Remaining portions of the metal layer 62 are stripped by a wet etch or a dry etch. The metal silicide region 63 is exposed as shown in FIG. 3G.

Figure 3H:
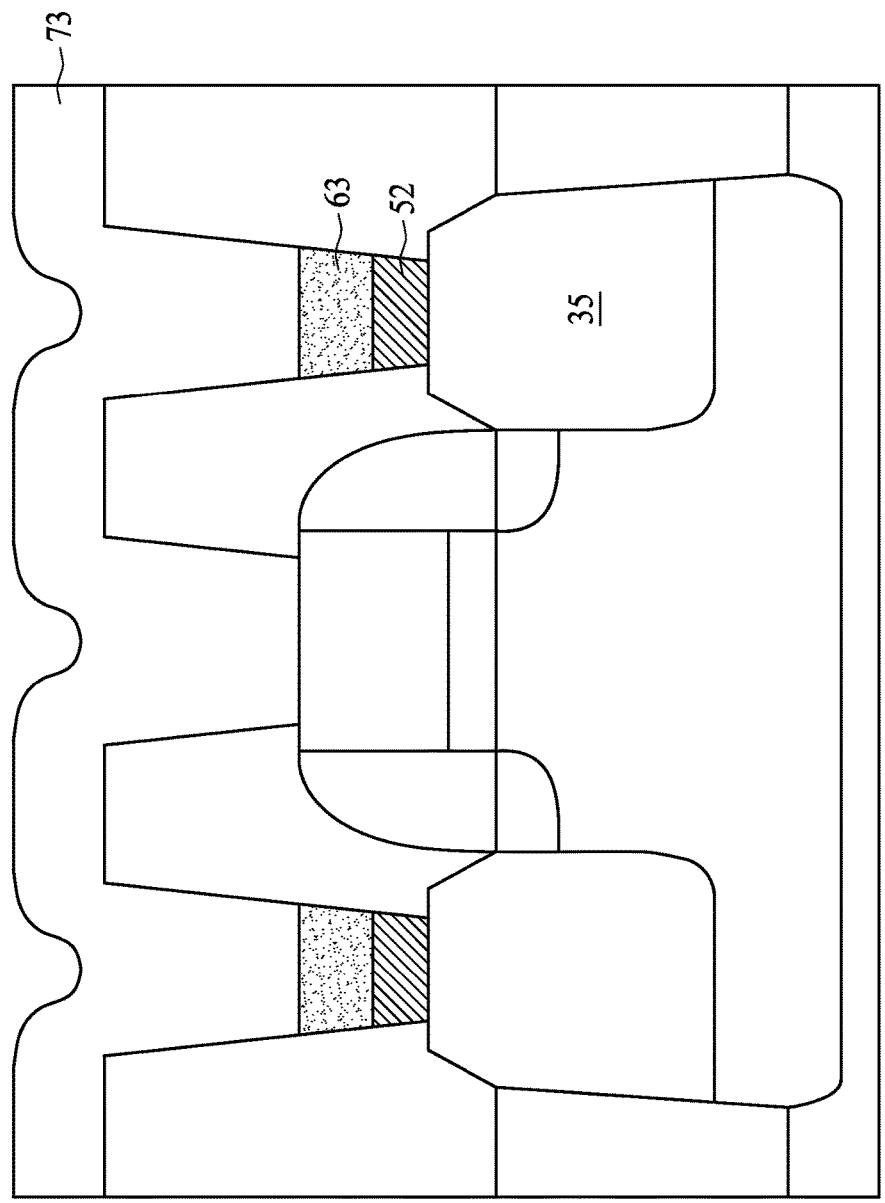
Figure 3I:
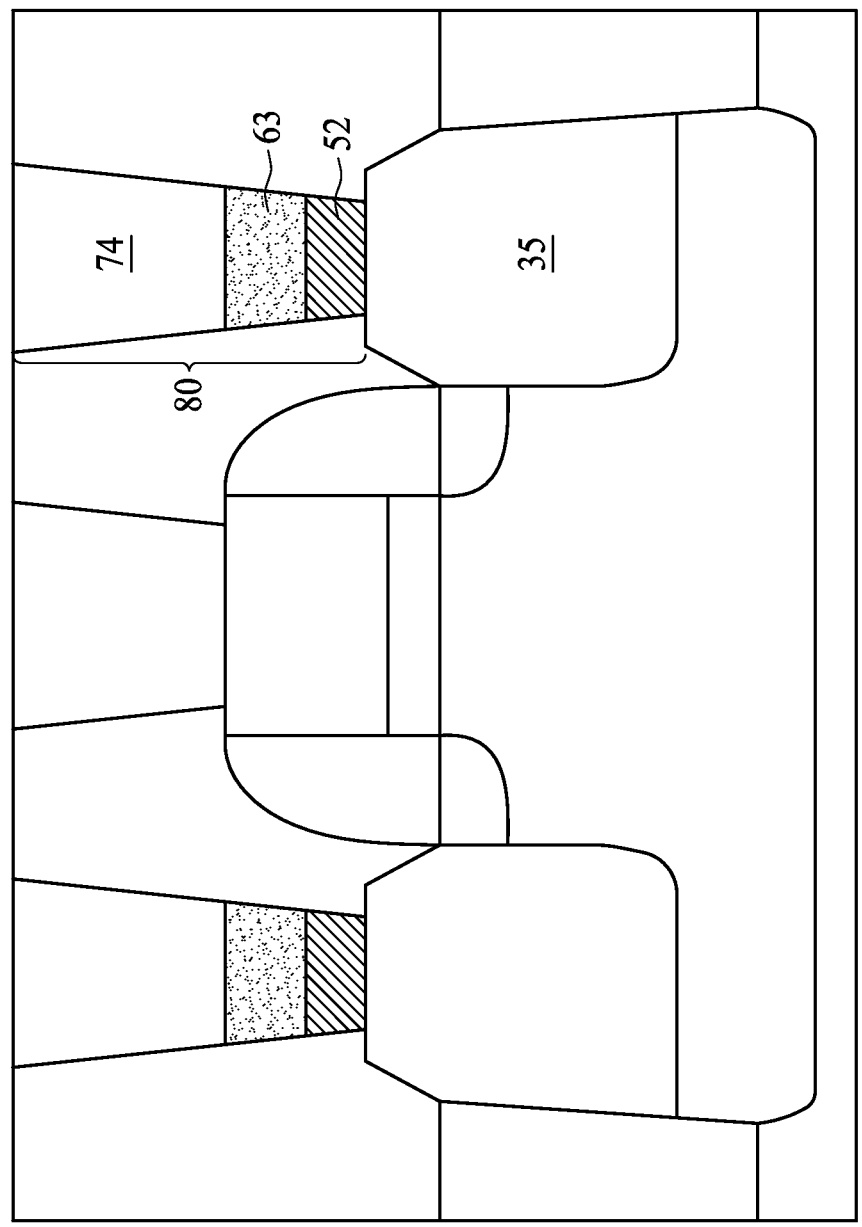

Referring to FIG. 3H, a contact metal layer 73 is deposited in a blanketed fashion into the contact opening 29 so as to be in contact with the metal silicide region 63. The contact metal includes copper, aluminum, or tungsten. Later, a polishing process, such as Chemical Mechanical Polishing, is used to remove uneven portions of the contact metal layer 73. As such, a metal region 74 is thus formed in the contact opening 29 as shown in FIG. 3I.

In brief, the doped region 52 provides a lower contact resistance between the interconnect plug 80 and the raised source/drain region 35. The contact resistance is a major contributor to the total resistance. The doped region 52 located between the raised source/drain region 35 and the metal silicide region 63 is able to reduce the contact resistance. Thus, the drive current of the semiconductor device 100 is boosted because the total resistance is dramatically reduced. The present disclosure provides a better current performance for semiconductor devices.

In some embodiments, a semiconductor device includes a metal oxide semiconductor device disposed over a substrate and an interconnect plug. The metal oxide semiconductor device includes a gate structure located on the substrate and a raised source/drain region disposed adjacent to the gate structure. The raised source/drain region includes a top surface above a surface of the substrate by a distance. The interconnect plug connects to the raised source/drain region. The interconnect plug includes a doped region contacting the top surface of the raised source/drain region, a metal silicide region located on the doped region, and a metal region located on the metal silicide region.

In some embodiments, the doped region includes a dopant concentration higher than that of the raised source/drain region.

In some embodiments, the top surface of the raised source/drain region angles with a sidewall of the doped region by less than 90 degrees.

In some embodiments, the raised source/drain region tapers from the surface of the substrate toward the doped region. The doped region tapers from the topmost portion toward the raised source/drain region.

In some embodiments, the gate structure is apart from a raised portion of the raised source/drain region.

In some embodiments, a contacting area between the doped region and the raised source/drain region is smaller than the top surface.

In some embodiments, the raised source/drain region includes a dopant material that is the same as that of the doped region.

In some embodiments, a semiconductor device includes a metal oxide semiconductor device disposed over a substrate and an interconnect plug. The metal oxide semiconductor device includes a gate structure located on the substrate and a crystallized raised source/drain region disposed adjacent to the gate structure. The crystallized raised source/drain region includes a top surface above a surface of the substrate by a distance. The interconnect plug connects to the top surface. In addition, the interconnect plug tapers from the topmost portion toward the top surface. The interconnect plug further includes a semiconductor crystallized doped region at the bottom of the interconnect plug contacting the top surface, wherein a contacting area is smaller than the top surface.

In some embodiments, the semiconductor crystallized doped region includes an epitaxial semiconductor material that is the same as that of the crystallized raised source/drain region. The crystallized doped region includes a dopant concentration from 10 to 100 times higher than that of the crystallized raised source/drain region.

In some embodiments, the crystallized raised source/drain region includes a dopant material that is the same as that of the crystallized doped region.

In some embodiments, the crystallized doped region has a thickness of about 5 angstroms to 20 angstroms. The distance (H) ranges from about 5 angstroms to 15 angstroms.

In some embodiments, a metal silicide region is formed by an upper portion of the crystallized doped region and located on the crystallized doped region.

In some embodiments, the crystallized raised source/drain region tapers from the surface of the substrate toward the crystallized doped region.

In some embodiments, the gate structure is apart from a raised portion of the crystallized raised source/drain region.

In some embodiments, a method for manufacturing a semiconductor device includes providing a substrate including a gate structure located on the substrate, and a raised source/drain region disposed adjacent to the gate structure, wherein the raised source/drain region includes a top surface above a surface of the substrate by a distance; forming a dielectric layer over the substrate; forming a contact opening in the dielectric layer; performing a first epitaxial deposition process to form a doped region in the contact opening, wherein the doped region connects with the raised source/drain region; and forming a metal silicide region based on an upper portion of the doped region.

In some embodiments, the contact opening exposes a portion of the top surface of the raised source/drain region. The contact opening tapers from the topmost portion of the dielectric layer toward the top surface.

In some embodiments, formation of the raised source/drain region further includes forming a cavity in the substrate and adjacent to the gate structure, and epitaxially growing a film to fill the cavity by a second epitaxial deposition process, thereby forming the raised source/drain.

In some embodiments, the first epitaxial deposition process includes a first dopant concentration that is higher than that of the second epitaxial deposition process. The first epitaxial deposition process includes an epitaxial semiconductor material that is the same as that of the second epitaxial deposition process.

In some embodiments, formation of the metal silicide region further includes depositing metal to cover the dielectric layer and the doped region, and performing an annealing process to silicide the upper portion of the doped region.

In some embodiments, the method further includes depositing a contact metal into the contact opening so that the contact metal will be in contact with the metal silicide region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising: a metal oxide semiconductor device disposed over a substrate, comprising: a gate structure located on a surface of the substrate; a raised source/drain region with a uniform dopant concentration, adjacent to the gate structure and partially under the surface of the substrate, wherein a peak dopant concentration of the raised source/drain region is in a range of from about 1E19 atoms/cm$^3$ to less than 1E20 atoms/cm$^3$, the raised source/drain region comprises a top surface above the surface of the substrate; and an interconnect plug connected to the raised source/drain region, the interconnect plug comprising: a doped region contacting the top surface of the raised source/drain region; a metal silicide region located on and in contact with the doped region; and a metal region located on the metal silicide region, wherein the doped region above the top surface of the raised source/drain region comprising a dopant concentration from 10 to 100 times higher than the peak dopant concentration of the raised source/drain region.

2. The semiconductor device of claim 1, wherein a portion of the top surface of the raised source/drain region not in contact with the doped region angles with a sidewall of the doped region by less than 90 degrees.

3. The semiconductor device of claim 1, wherein the raised source/drain region tapers from the surface of the substrate toward the doped region, and the doped region tapers from the topmost portion toward the raised source/drain region.

4. The semiconductor device of claim 1, wherein the gate structure is apart from a raised portion of the raised source/drain region.

5. The semiconductor device of claim 1, wherein a contacting area between the doped region and the raised source/drain region is smaller than the top surface.

6. The semiconductor device of claim 1, wherein the raised source/drain region comprises a dopant material that is the same as that of the doped region.

7. A semiconductor device, comprising: a metal oxide semiconductor device disposed over a substrate, comprising: a gate structure located on a surface of the substrate; a crystallized raised source/drain region with a uniform dopant concentration, adjacent to the gate structure and partially under the surface of the substrate, wherein the crystallized raised source/drain region comprises a top surface above the surface of the substrate by a distance, a peak dopant concentration of the raised source/drain region is in a range of from about 1E19 atoms/cm$^3$ to less than 1E20 atoms/cm$^3$, and an interconnect plug connected to the top surface, wherein the interconnect plug tapers from the topmost portion toward the top surface, comprising: a semiconductor crystallized doped region at the bottom of the interconnect plug contacting the top surface, wherein a contacting area is smaller than the top surface, wherein a dopant concentration of the semiconductor crystallized doped region above the top surface of the crystallized raised source/drain region is 10 to 100 times greater than the peak dopant concentration of the crystallized raised source/drain region.

8. The semiconductor device of claim 7, wherein the crystallized raised source/drain region comprises a dopant material that is the same as that of the crystallized doped region.

9. The semiconductor device of claim 7, wherein the crystallized doped region has a thickness of about 5 angstroms to 20 angstroms, and the distance ranges from about 5 angstroms to 15 angstroms.

10. The semiconductor device of claim 7, further comprising a metal silicide region formed by an upper portion of the crystallized doped region and located on the crystallized doped region.

11. The semiconductor device of claim 7, wherein the crystallized raised source/drain region tapers from the surface of the substrate toward the crystallized doped region.

12. The semiconductor device of claim 7, wherein the gate structure is apart from a raised portion of the crystallized raised source/drain region.

13. The semiconductor device of claim 1, wherein the raised source/drain region comprises a top surface above a surface of the substrate by a distance of from about 5 angstroms to about 25 angstroms.

14. The semiconductor device of claim 1, wherein the metal region, the metal silicide region, and the doped region form a conductivity gradient from high to low.

15. The semiconductor device of claim 7, wherein the a portion of the top surface of the crystallized raised source/drain region not in contact with the semiconductor crystallized doped region angles with a sidewall of the semiconductor crystallized doped region by less than 90 degrees.

16. The semiconductor device of claim 7, wherein a thickness ratio between the semiconductor crystallized doped region and the distance is in a range of from about 1:1 to about 2:1.

17. The semiconductor device of claim 7, wherein a thickness of the semiconductor crystallized doped region and the distance is in a range from about 25 angstroms to 40 angstroms.

18. A semiconductor device, comprising: a gate structure located on a surface of a substrate; a raised source/drain region with a uniform dopant concentration, adjacent to the gate structure, partially under the top surface of the substrate, comprising a top surface above the surface of the substrate, a peak dopant concentration of the raised source/drain region being in a range of from about 1E19 atoms/cm$^3$ to less than 1E20 atoms/cm$^3$; and a doped region contacting the top surface of the raised source/drain region, a contacting area between the doped region and the raised source/drain region is smaller than an area of the top surface; wherein the doped region above the top surface of the raised source/drain region comprises a dopant concentration from 10 to 100 times higher than the peak dopant concentration of the raised source/drain region.

19. The semiconductor device of claim 18, wherein the metal silicide region is disposed over the doped region.

* * * * *